United States Patent [19]
Takahashi

[11] Patent Number: 6,134,163
[45] Date of Patent: *Oct. 17, 2000

[54] SEMICONDUCTOR MEMORY DEVICE WITH INDEPENDENTLY OPERATING MEMORY BANKS

[75] Inventor: Hiroki Takahashi, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/086,066

[22] Filed: May 29, 1998

[30] Foreign Application Priority Data

May 29, 1997 [JP] Japan ................................ 9-139997

[51] Int. Cl.$^7$ .................................................. G11C 7/00
[52] U.S. Cl. .......................... 365/205; 365/51; 365/63; 365/230.03
[58] Field of Search .................... 365/205, 207, 365/230.03, 189.01, 230.01, 51, 63

[56] References Cited

U.S. PATENT DOCUMENTS

| | | | |
|---|---|---|---|
| 5,313,431 | 5/1994 | Uruma et al. | 365/230.05 |
| 5,546,349 | 8/1996 | Watanabe et al. | 365/230.04 |
| 5,553,028 | 9/1996 | McLaury | 365/205 |
| 5,594,704 | 1/1997 | Konishi et al. | 365/233 |
| 5,822,264 | 10/1998 | Tomishima et al. | 365/222 |

FOREIGN PATENT DOCUMENTS

0 260 503   3/1988   European Pat. Off. .

*Primary Examiner*—David Nelms
*Assistant Examiner*—Hoai V. Ho
*Attorney, Agent, or Firm*—Sughrue, Mion, Zinn, Macpeak & Seas, PLLC

[57] ABSTRACT

The semiconductor memory device according to the present invention includes N (N is a positive even number) units of independently operating memory banks arranged in a line in a first direction, I/O bus lines which are connected respectively to the bit lines of the N memory banks and extend in the first direction, and a data amplifier circuit which amplifies and outputs data on the I/O bus lines. The data amplifier circuit is arranged between the N/2-th memory bank and the (N/2+1)-th memory bank, and the I/O bus lines are divided into first I/O bus lines and second I/O bus lines which are connected respectively to the data amplifier circuit.

13 Claims, 7 Drawing Sheets

SEMICONDUCTOR MEMORY DEVICE WITH INDEPENDENTLY OPERATING MEMORY BANKS

BACKGROUND OF THE INVENTION

1. Field of the Invention

The present invention relates to a semiconductor memory device having a multibank configuration.

2. Description of the Related Art

In a large capacity memory such as a 64M or 256M DRAM, it is a widespread practice to adopt a method in which a plurality of independently operating memory banks are provided within a chip to be interleaved among these banks.

For instance, in the case of a memory with a wide internal bus width such as a 64M DRAM having four banks of 16M each, the configuration of the banks is such that, they are arranged in a line with the short side of each bank placed along the short side of the chip, and I/O bus lines are shared among the banks, for the purpose of improving the integration level. In particular, in a high speed DRAM with the operating frequency ranging from 800 MHz to 1 GHz, it is necessary to provide the I/O pads at a chip edge because of the conspicuous deterioration in the transmission characteristics due to inductance of several nH existing in the lead frame. Accordingly, it is necessary to arrange the pads, external I/O circuits, and an edge of the chip.

Figure 1:
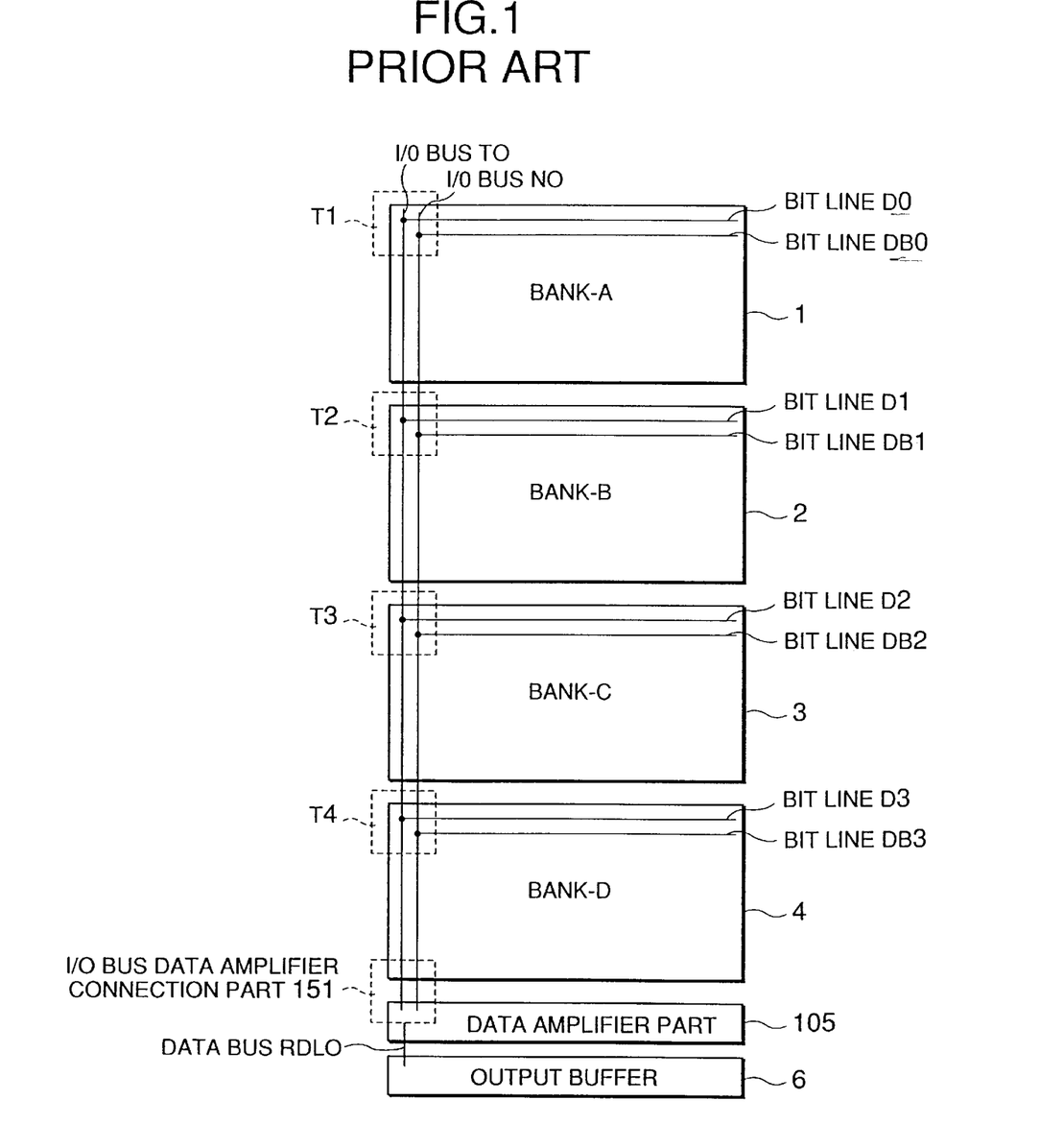
FIG. 1 is a block diagram showing a conventional semiconductor memory device.

Referring to FIG. 1, a conventional semiconductor memory device with multibank configuration will be described. This conventional semiconductor memory device is provided with bank-A 1, bank-B 2, bank-C 3, and bank-D 4 arranged in the direction of the short side of each bank, complementary I/O buses T0 and N0 shared by the bank-A 1 to bank-D 4, a data amplifier part 105 which reads data on the I/O buses T0 and N0 and outputs the read data to a data bus RDL0, and an output buffer 6 which outputs the output data in response to the supply of read data from the data bus RDL0.

The data amplifier part 105 is provided with an I/O bus data amplifier connection part 151 which is the connection section with the I/O buses TO and NO, and carries out the reading of various banks.

The I/O buses T0 and N0 are connected respectively to bit lines D0 and DB0 which are complementary with each other on the bank-A 1, bit lines D1 and DB1 complementary on the bank-B 2, bit lines D2 and DB2 complementary on the bank-C 3, and bit lines D3 and DB3 complementary on the bank-D 4.

Figure 2:
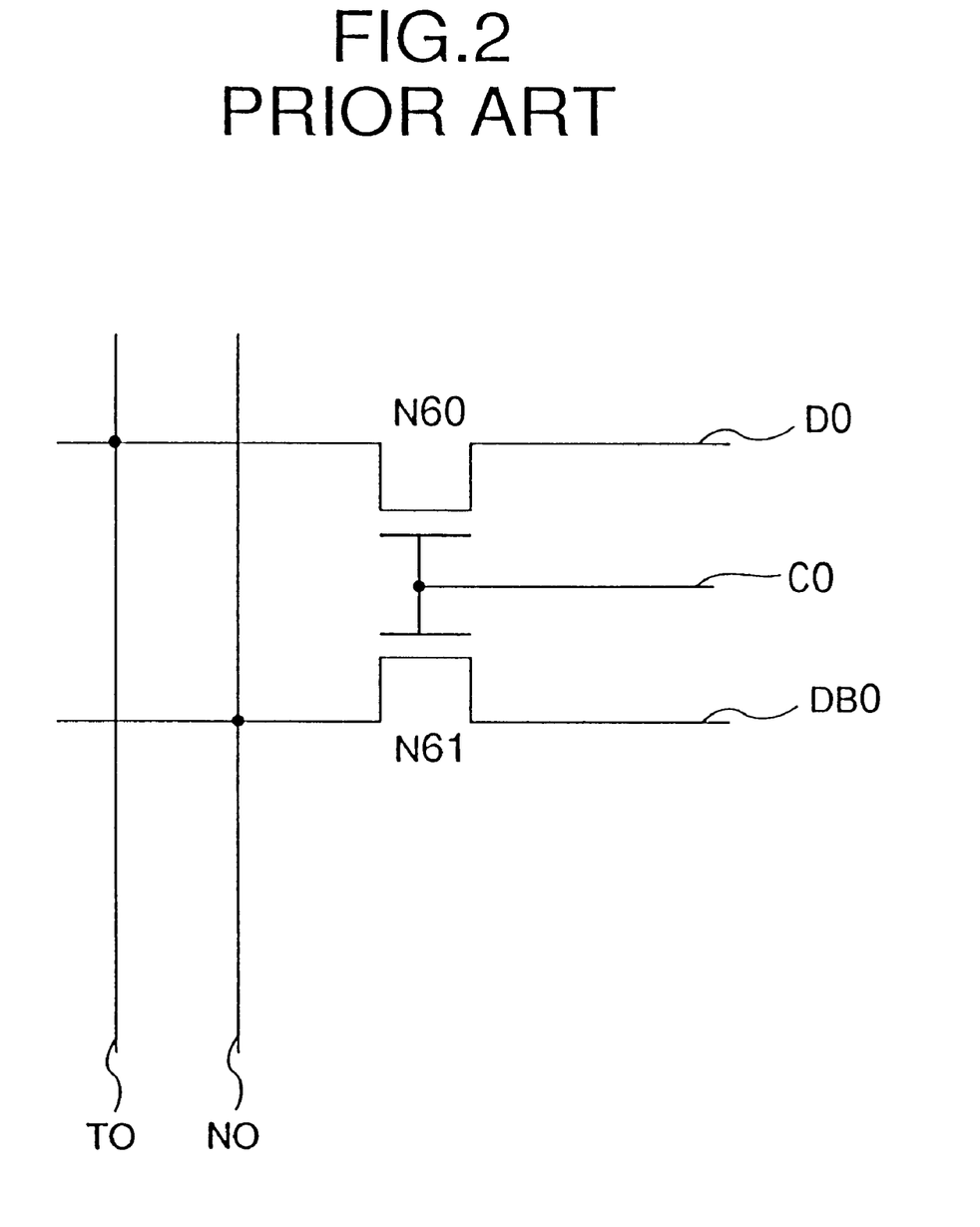
FIG. 2 is a circuit diagram showing connection part of the conventional I/O bus and bit lines.

Referring to FIG. 2 showing a detailed circuit diagram of an I/O bus and bit line connection part T1 which is the connection section of the I/O buses T0 and N0 with the bit lines D0 and DB0, this I/O bus bit line connection part T1 is provided with NMOS transistors N60 and N61 whose respective drains are connected to I/O buses T0 and N0, respectively, whose respective sources are connected to the bit lines D0 and DB0, respectively, and whose respective gates are connected in common and is connected to a column selection signal line C0. In addition, though not shown, the bit lines D0 and DB0 are connected to memory cells and to sense amplifiers for amplifying the data in the memory cells.

Similarly, an I/O bus bit line connection part T2 is connected to the I/O buses T0 and N0 and the bit lines D1 and DB1, an I/O bus bit line connection part T3 is connected to the I/O buses T0 and N0 and the bit lines D2 and DB2, and an I/O bus bit line connection part T4 is connected to the I/O buses T0 and N0 and the bit lines D3 and DB3.

Figure 3:
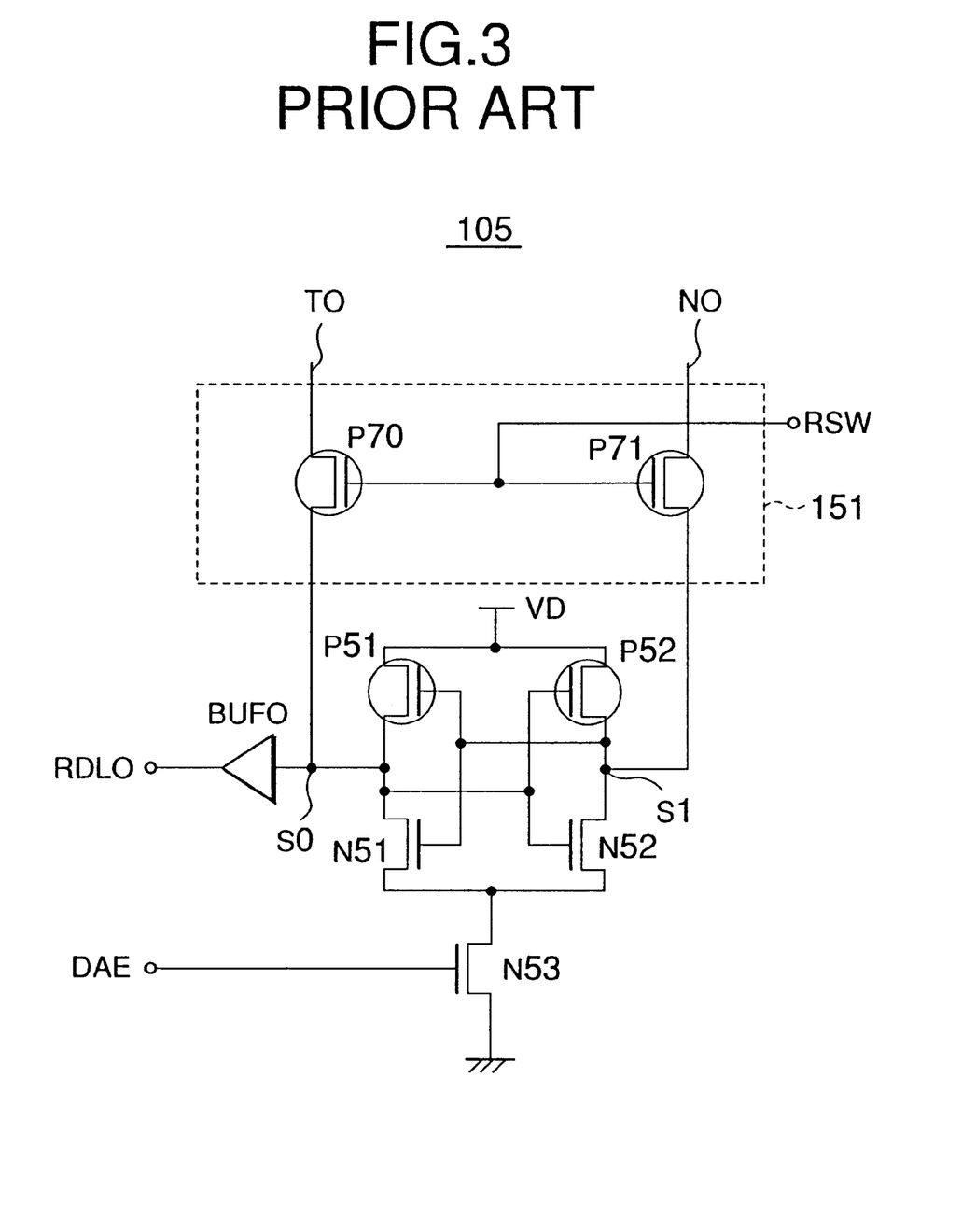
FIG. 3 is a circuit diagram showing a conventional data amplifier.

Referring to FIG. 3 showing a detailed circuit diagram of the data amplifier part 105 and the I/O bus data amplifier connection part 151, the I/O bus data amplifier connection part 151 is provided with PMOS transistors P70 and P71 whose respective sources are connected to the I/O buses T0 and N0, respectively, whose respective drains are connected to nodes S0 and S1, respectively, of the data amplifier part 105, and whose respective gates are connected in common and is connected to an I/O bus selection signal RSW.

The data amplifier part 105 is a latch type data amplifier part in which data are read by latch action. It is provided with PMOS transistors P51 and P52 whose respective sources are connected to a power supply VD and whose respective gates are mutually connected to the drains of the opposite transistors, NMOS transistors N51 and N52 whose respective drains are connected to the drains of the transistors P51 and P52, respectively, to form complementary output nodes S0 and S1, whose respective gates are connected to the gates of the transistors P51 and P52, respectively, and whose respective sources are connected in common, an NMOS transistor N53 whose drain is connected to the common connection point of the transistors N51 and N52, whose source is connected to the ground, and whose gate is connected to a data amplifier activation signal DAE, and a buffer BUF0 which is connected to the node S0 and outputs an output signal after buffering it to the data bus RDL0.

Next, the read operation of the conventional semiconductor memory device will be described. First, assume that an H level and L level read data are generated on the bit lines D0 and DB0, respectively. The NMOS transistors N60 and N61 are energized in response to the transition of the column selection signal line C0 to the H level, and corresponding to the read data, transfer H and L level potentials to the I/O buses T0 and N0, respectively. As a result, the potential of the I/O bus N0 becomes lower compared with the potential of the I/O bus T0, and a potential difference of, for example, 300 mV is generated between the I/O buses T0 and N0. This potential difference is transmitted to the nodes S0 and S1 of the data amplifier part 105 by bringing the I/O bus selection signal RSW to the L level, and bringing the transistors P70 and P71 of the I/O bus data amplifier connection part 151 to the energized state. In this state, the nodes S0 and S1 are brought to H and L levels, respectively, by bringing a data amplifier activation signal DAE to the H level and energizing the transistor N53 to amplify the potential difference. In this way, the buffer amplifier BUF0 outputs the H level of the node S0 to the data bus RDL0 to transmit the H level to the data bus RSL0. The data on the data bus RDL0 is output to the outside by the output buffer 6.

The read operation for the other banks, namely, bank-B to bank-D, is similar to the above, and the data on the bit lines connected to respective banks are output to the outside.

The conventional memory device described above has a configuration in which the short sides of a plurality of banks are arranged in a line along the direction of the short side of the chip, and the I/O bus lines are shared by these banks. Accordingly, the length of the I/O bus lines is almost equal to the length of the short side of the chip, so that the load-carrying capacitance per I/O bus line is very high. Therefore, when the banks A and B, which are arranged on the other side of, and are situated physically away from, the data amplifier part, are to be accessed, the data transfer from the bit lines to the I/O bus lines takes a long time, which leads to a drawback that it is a factor in the deterioration of the read access speed.

BRIEF SUMMARY OF THE INVENTION

Object of the Invention

It is therefore the object of the present invention to provide a semiconductor memory device which is capable of relaxing the deterioration in the read rate accompanying the increase in the length of the I/O buses.

Summary of the Invention

The semiconductor memory device according to this invention includes N (N is a positive even number) independently operating memory banks which are arranged in a line in a first direction, I/O buses extending in the first direction and are connected in common to respective bit lines of the N memory banks, and a data amplifier circuit which amplifies and outputs data on the I/O buses. The data amplifier circuit is arranged between the (N/2)-th memory bank and the (N/2+1)-th memory bank, and the I/O buses are divided into a first I/O bus and a second I/O bus which are respectively connected to the data amplifier circuits.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE INVENTION

Figure 4:
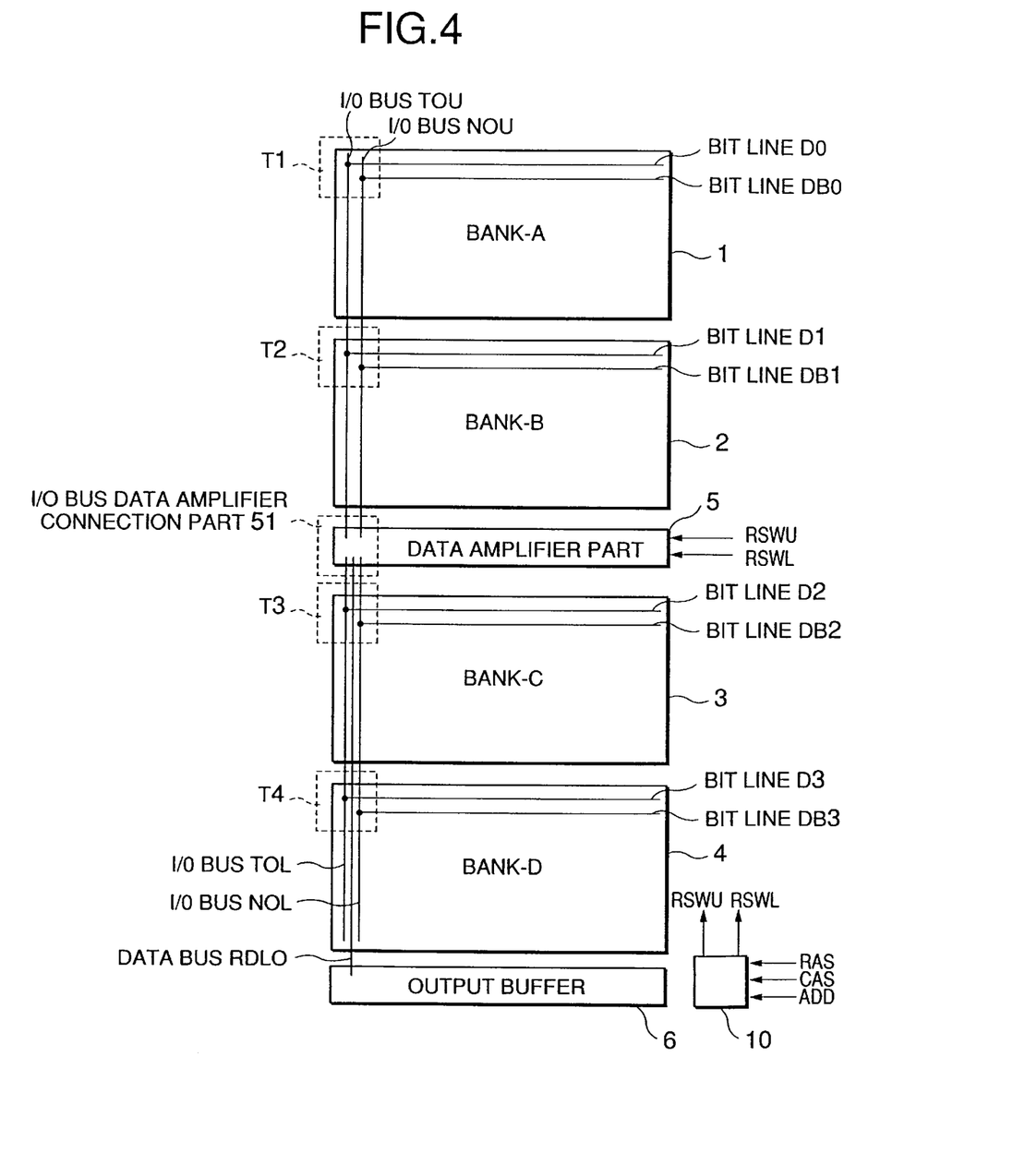
FIG. 4 is a block diagram showing a first embodiment of the semiconductor memory device according to this invention.

Referring to FIG. 4, a first embodiment of this invention will be described. In FIG. 4, constituents common to those of FIG. 1 are given common reference symbols/numerals. The semiconductor memory device of this invention is provided with independently operating bank-A 1, bank-B 2, bank-C 3, and bank-D 4 which are arranged in the direction of the short side of each bank, and an output buffer 6. In addition to these, this embodiment is provided with complementary I/O buses T0U and N0U shared by the bank-A 1 and the bank-B 2, and complementary I/O buses T0L and N0L shared by the bank-C 3 and the bank-D 4, obtained by dividing the I/O buses T0 and N0 of the conventional memory device into two parts, used in place of the I/O buses T0 and N0, and a data amplifier part 5 arranged between the bank-B 2 and the bank-C 3 which reads data on the I/O buses T0U and N0U, and I/O buses T0L and N0L and outputs the read data to the data bus RDL0, which is used in place of the data amplifier part 105 of the conventional memory device. Here, the I/O buses T0U and N0U, and the I/O buses T0L and N0L have almost equal lengths, respectively.

The data amplifier part 5 is the connection section between the I/O buses T0U and N0U, and the I/O buses T0L and N0L, and is provided with an I/O bus data connection part 51 which carries out data read of respective banks.

In addition, this embodiment is provided with a control circuit 10 which generates selection signals RSWU and RSWL based on strobe signals RAS and CAS, and an address signal ADD, and supplies the result to the data amplifier part 5.

Figure 5:
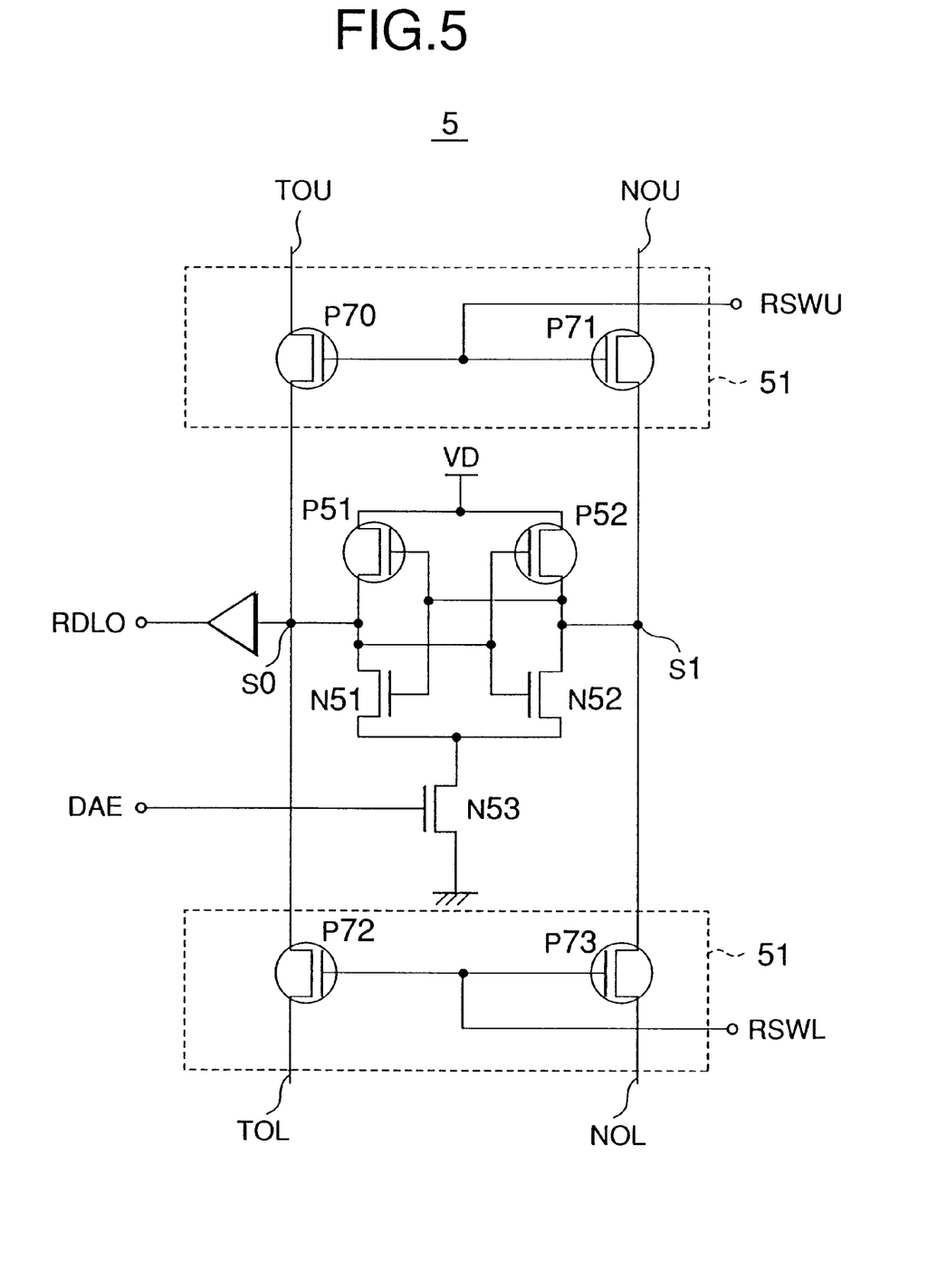
FIG. 5 is a circuit diagram of the data amplifier shown in FIG. 4.

Referring to FIG. 5 which shows a detailed circuit diagram of the data amplifier part 5 and the I/O bus data amplifier connection part 51, the I/O bus data amplifier connection part 51 is provided with PMOS transistors P70 and P71 whose respective sources are connected to the I/O buses T0U and N0U, respectively, whose respective drains are connected to the nodes S0 and S1, respectively, of the data amplifier part 5, and whose respective gates are connected in common, and is connected to the I/O bus selection signal RSWU, and PMOS switching transistors P72 and P73 whose respective sources are connected to the I/O buses T0L and N0L, respectively, whose respective drains are connected to the nodes S0 and S1, respectively, of the data amplifier part 5, and whose respective gates are connected in common, and is connected to the I/O bus selection signal RSWL.

The data amplifier part 5 is a latch type data amplifier part which reads data by latching operation. Except for the fact that the drains of the transistors of P70 and P72 are connected to the node S0, and the drains of the transistors P71 and P73 are connected to the node S1, it is the same as the conventional data amplifier part 105.

Next, the read operation of this embodiment will be described. First, in the read operation out of the banks A and B, the I/O bus selection signal RSWU is brought to the L level to energize the transistors P70 and P71. At the same time, the I/O bus selection signal RSWL is brought to the H level to deenergize the transistors P72 and P73. As a result of this operation, the data amplifier part is connected only to the I/O buses T0U and N0U shared by the banks A and B. In this state, by bringing the data amplifier activation signal DAE to the H level to energize the transistor N53, the potential difference between the I/O buses T0U and N0U can be amplified in the same manner as in the conventional device. The data amplified by the data amplifier part 5 is output to the data bus RDL0 via the buffer amplifier BUF0. The data on the data bus RDL0 are output to the outside by the output buffer 6.

Next, in the read operation out of the banks C and D, the I/O bus selection signal RSWL is brought to the L level to energize the transistors P72 and P73. At the same time, the I/O bus selection signal RSWU is brought to the H level to deenergize the transistors P70 and P71. As a result of this operation, the data amplifier part 5 is put to the state in which it is connected only to the I/O buses T0L and N0L shared by the banks C and D. In this state, the potential difference between the I/O buses T0L and N0L is amplified by bringing the data amplifier activation signal DAE to the H level to energize the transistor N53. The data amplified by the data amplifier part 5 are output to the data bus RDL0 via the buffer amplifier BUF0, and are further output to the outside by the output buffer 6.

As in the above, in this embodiment the data amplifier part 5 is arranged at the center of the bank group, namely, at the midpoint which divides the I/O buses T0 and N0 of the conventional device into two parts. Accordingly, it is possible to prevent the increase in the length of the I/O buses accompanying the increase in the storage capacity by controlling the connection of the I/O buses T0 and N0 with the switch consisting of the transistors P70 to P73 of the I/O bus data connection part 51 belonging to the data amplifier part 5.

Figure 6:
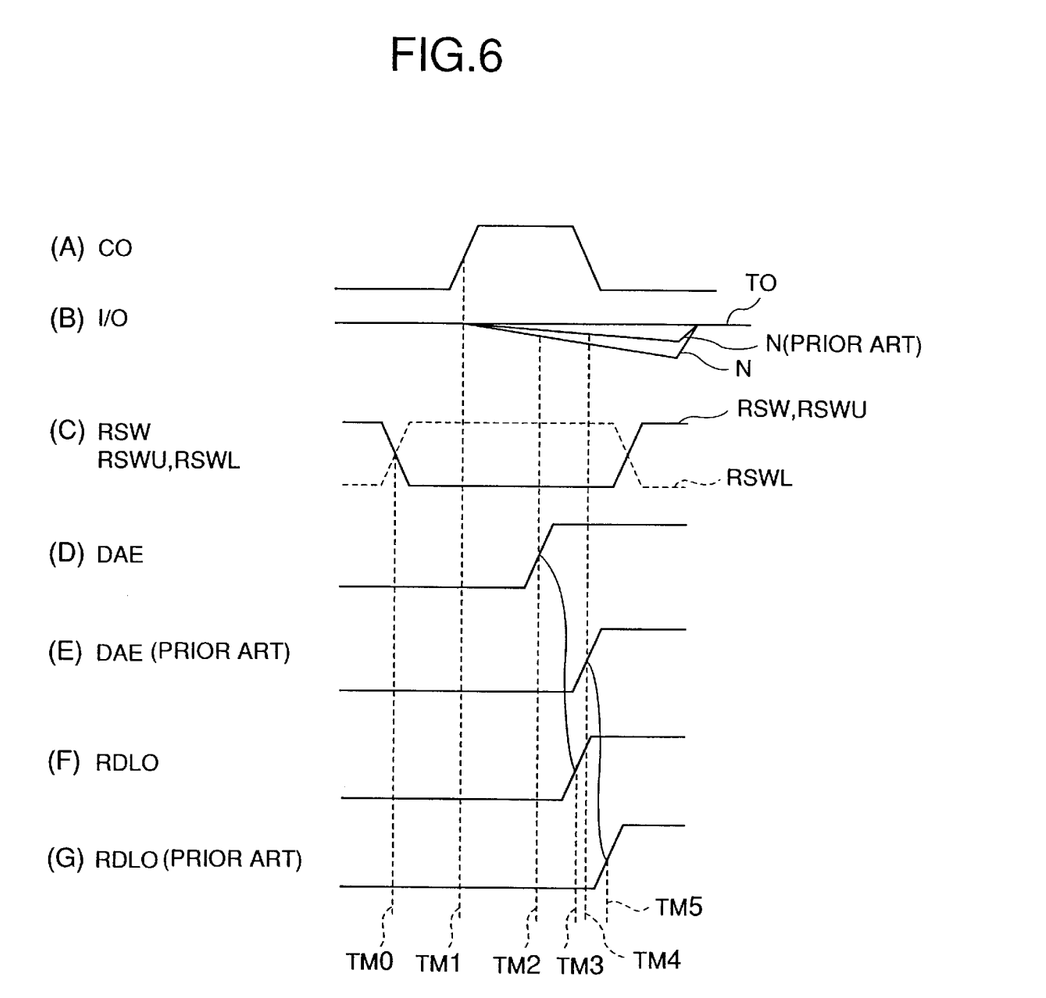
FIG. 6 is a waveform diagram for describing the operation of this invention.

Referring to FIG. 6 which shows the signal waveforms of various parts during the read operation, the effect of the invention will be described. The read operation starts at the time TM0 when a desired I/O bus is connected to the data amplifier by means of the I/O bus selection signal RSWU or RSWL in this embodiment, or the I/O bus selection signal RSW in the conventional device. When the column selection signal C0 is brought to H level at the time TM1, the transfer of the bit line data to the I/O buses starts at this time TM1. In the mode of this embodiment, the data amplifier activation signal DAE is brought to H level accompanying the generation, at the time TM2, of a potential difference (for example, 300 mV) which is capable of actuating the data amplifier part 5 between the I/O buses T0U (L) and N0U (L). With this operation, an H level signal is obtained for the data bus RDL0 at the time TM3.

On the other hand, in the conventional device, the data amplifier activation signal DAE is brought to the H level accompanying the generation of a potential difference which is capable of actuating the data amplifier 105 between the I/O buses T0 and N0. As a result, H level is obtained for the data bus RDL0 at the time TM5. Accordingly, the difference between the conventional device and the present embodiment resides in the difference (TM4–TM2) between the time TM4 and the time TM2 which correspond respectively to the length of the I/O buses T0 and N0, and the I/O buses T0U (L) and N0U (L).

As an example of simulation, in the case of generally employed 64M DRAM of four-bank configuration, it was confirmed that the difference (TM4–TM2) for the potential difference 300 mV is about 2 ns.

Figure 7:
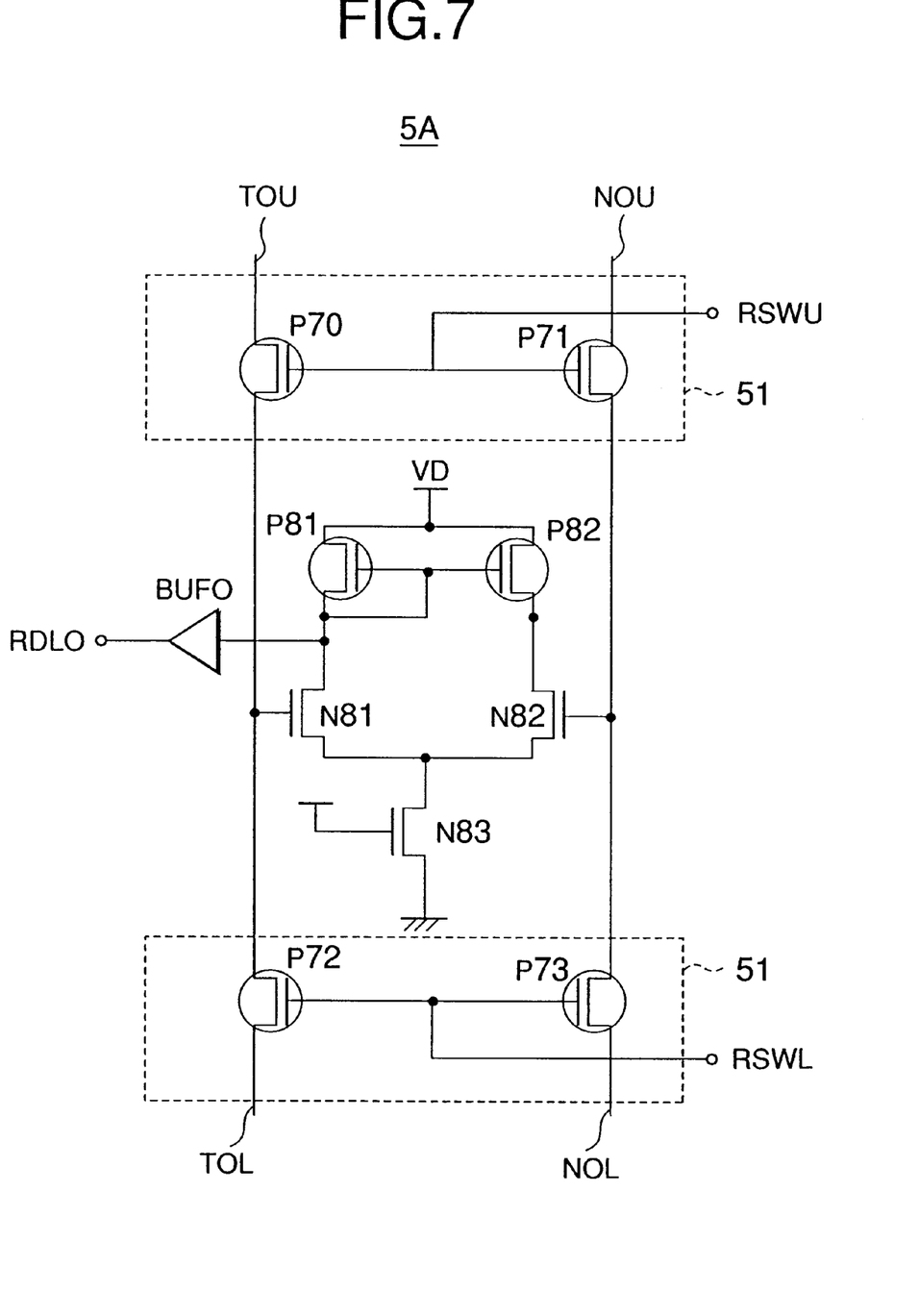
FIG. 7 is a circuit diagram of the data amplifier for describing a second embodiment of this invention.

Next, referring to FIG. 7, a second embodiment of this invention will be described. The difference between the data amplifier part 5A of this embodiment and the data amplifier part 5 of the first embodiment is that the data amplifier of this embodiment is the adoption of a differential amplification type data amplifier formed of a differential amplifier circuit using a current mirror circuit instead of a latch circuit as the active load.

The data amplifier part 5A is provided with a PMOS transistor P81 with its source connected to a power supply VD, its gate and drain connected in common, and has an output node S3, a PMOS transistor P82 with its source connected to the power supply VD, and forms a current mirror with the transistor P81 by having its gate connected in common with the gate of the transistor P81, NMOS transistors N81 and N82 with their respective drains connected to the respective drains of the transistors P81 and P82, their respective gates connected to complementary nodes S0 and S1, and their respective sources are connected in common to form a differential circuit, an NMOS transistor N83 with its drain connected to the common connection point of the sources of the transistors N81 and N82, its source connected to the ground, and its gate connected to a power supply, and a buffer BUF0 with its input terminal connected to the common connection point of the drains of the transistors P81 and N81 to buffer the output signal and outputs the result to the data bus RDL0.

Next, the read operation of this embodiment will be described. First, in the reading out of the banks A and B, the I/O bus selection signal RSWU is brought to the L level to energize the transistors P70 and P71, the same as in the first embodiment. At the same time, the I/O bus selection signal RSWL is brought to the H level to deenergize the transistors P72 and P73. As a result of this operation, the data amplifier part 5A goes to the state connected to the I/O buses T0U and N0U shared by the banks A and B.

In this state, the data amplifier part 5A automatically amplifies the potential difference between the I/O buses T0U and N0U. The data amplified by the data amplifier part 5A are output from the node S3 to the data bus RDL0 via the buffer amplifier BUF0. The data on the data bus TDL0 is output to the outside by the output buffer 6.

Next, in the reading out of the banks C and D, the I/O bus selection signal RSWL is brought to the L level to energize the transistors P72 and P73, and the I/O bus selection signal RSWU is brought to the H level to deenergize the transistors P70 and P71. As a result of this operation, the data amplifier part 5A goes to the state in which it is connected only to the I/O buses T0L and N0L shared by the banks C and D. In this state, the data amplifier part 5A automatically amplifies the potential difference between the I/O buses T0L and N0L. The amplified data are output to the data bus RDL0 via the buffer amplifier BUF0, and is then output to the outside by the output buffer 6.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device comprising:
   N (N is a positive even number) units of memory banks arranged in a line in that order from the first unit in a first direction;
   a plurality of bit lines each extending in a second direction perpendicular to said first direction, each of bit lines arranged in a corresponding one of said memory banks;
   a plurality of I/O bus lines each extending in said first direction and connected to the respective bit lines of said N memory banks; and
   a data amplifier circuit for amplifying and outputting data on said I/O bus lines, said data amplifier circuit arranged between the N/2-th bank and the (N/2+1)-th bank of said memory banks so that said I/O bus lines are divided into first I/O bus lines and second I/O bus lines which are connected respectively to said data amplifier circuit.

2. The semiconductor memory device as claimed in claim 1, wherein said data amplifier circuit includes a connection part in which the data amplifier circuits is connected with said first I/O bus lines and said second I/O bus lines.

3. The semiconductor memory device as claimed in claim 1, wherein said first I/O bus lines and said second I/O bus lines consist respectively of complementary bus line pairs.

4. The semiconductor memory device as claimed in claim 1, wherein the length of said first I/O bus lines is substantially equal to the length of said second I/O bus lines.

5. The semiconductor memory device as claimed in claim 1, wherein said data amplifier circuit includes a latch type data amplifier circuit, a first switch circuit, provided between a data input terminal of said latch type data amplifier circuit and said first I/O bus lines, the energization of which is controlled by a first selection signal, and a second switch circuit, provided between the data input terminal of said latch type data amplifier circuit and said second I/O bus lines, the energization of which is controlled by a second selection signal.

6. The semiconductor memory device as claimed in claim 5, wherein the activation of said latch type data amplifier circuit is controlled by a data amplifier activation signal.

7. The semiconductor memory device as claimed in claim 1, wherein said data amplifier circuit includes a differential amplification type data amplifier circuit, a first switch circuit, provided between an input terminal of said differential amplification type data amplifier circuit and said first I/O bus lines, the energization of which is controlled by a first selection signal, and a second switch circuit, provided between the input terminal of said differential amplification type data amplifier circuit and said second I/O bus lines, the energization of which is controlled by a second selection signal.

8. A semiconductor memory device comprising:

a plurality of first memory banks;

a plurality of first bit lines each arranged in the respective first memory banks and each extending in a first direction;

a first I/O bus line connected to said first bit lines in said first memory banks in common said first I/O bus line extending in a second direction perpendicular to said first direction;

a plurality of second memory banks, said first memory banks and said second memory banks respectively operated independently;

a plurality of second bit lines each arranged in the respective second memory banks and each extending in said first direction;

a second I/O bus line connected to said second bit lines in said second memory banks in common, said second I/O bus line extending in said second direction, and the length of said first I/O bus line and the length of said second I/O bus line being substantially equal; and a data amplifier circuit connected to said first I/O bus line and said second I/O bus line so that said data amplifier circuit is arranged between said first memory banks and said second memory banks, and amplifiers and outputs either one of data on said first I/O bus line or data on said second I/O bus line in response to a selection signal.

9. The semiconductor memory device as claimed in claim 8, wherein said data amplifier circuit includes a connection part in which the data amplifier circuit is connected to said first I/O bus lines and said second I/O bus lines.

10. The semiconductor memory device as claimed in claim 8, wherein said data amplifier circuit includes a latch type data amplifier circuit, a first switch circuit, provided between the input terminal of said latch type data amplifier circuit and said first I/O bus lines, the energization of which is controlled by a first selection signal, and a second switch circuit, provided between the input terminal of said latch type data amplifier circuit and said second I/O bus lines, the energization of which is controlled by a second selection signal.

11. The semiconductor memory device as claimed in claim 10, wherein the activation of said latch type data amplifier circuit is controlled by a data amplifier activation signal.

12. The semiconductor memory device as claimed in claim 8, wherein said data amplifier circuit includes a differential amplification type data amplifier circuit, a first switch circuit, provided between the input terminal of said differential amplification type data amplifier circuit and said first I/O bus lines, the energization of which is controlled by a first selection signal, and a second switch circuit, provided between the input terminal of said differential amplification type data amplifier circuit and said second I/O bus lines, the energization of which is controlled by a second selection signal.

13. A semiconductor memory device comprising:

first to fourth memory banks arranged in a line in that order;

first to fourth bit lines each arranged in a corresponding one of said first to fourth memory banks, each of said first to fourth bit lines extending in a first direction;

a common I/O bus line coupled to said first to fourth bit lines in common and extending in a second direction perpendicular to said first direction;

an output buffer arranged adjacently to said first memory bank; and a data amplifier arranged between said second memory bank and said third memory bank and amplifying and outputting data on said common I/O bus line to said output buffer;

wherein said common I/O bus line substantially is divided in its central part, and said data amplifier is arranged at said central part of said common I/O bus line to couple to said common I/O bus line at its central part.

* * * * *